United States Patent
Choi et al.

(10) Patent No.: US 7,118,948 B2
(45) Date of Patent: Oct. 10, 2006

(54) SEMICONDUCTOR WAFER HAVING DIFFERENT IMPURITY CONCENTRATIONS IN RESPECTIVE REGIONS

(75) Inventors: Yong-bae Choi, Suwon-si (KR); Boo-yung Huh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 5 days.

(21) Appl. No.: 10/875,383

(22) Filed: Jun. 25, 2004

(65) Prior Publication Data
US 2005/0001240 A1    Jan. 6, 2005

(30) Foreign Application Priority Data
Jul. 1, 2003  (KR)  ............... 10-2003-0044350

(51) Int. Cl.
H01L 21/337  (2006.01)
H01L 21/8238 (2006.01)
H01L 21/425  (2006.01)
(52) U.S. Cl. .............. 438/194; 438/199; 438/527
(58) Field of Classification Search .......... 438/194, 438/199, 527
See application file for complete search history.

(56) References Cited

U.S. PATENT DOCUMENTS 6,586,807 B1 * 7/2003 Nishida et al. ............ 257/401
6,653,686 B1 * 11/2003 Wann ......................... 257/335

FOREIGN PATENT DOCUMENTS

JP     8055815        2/1996
KR     P1999-005862   1/1999

* cited by examiner

Primary Examiner—William M. Brewster
(74) Attorney, Agent, or Firm—Volentine Francos & Whitt, PLLC

(57) ABSTRACT

A semiconductor wafer has different impurity concentrations in respective regions and gate patterns have different lengths in the respective regions. The semiconductor wafer has different impurity concentrations in a central region, an intermediate region, and an outer region. The gate patterns have different lengths in the central region, the intermediate region, and the outer region. Accordingly, the semiconductor wafer may have a substantially uniform threshold voltage throughout the semiconductor wafer.

17 Claims, 3 Drawing Sheets

SEMICONDUCTOR WAFER HAVING DIFFERENT IMPURITY CONCENTRATIONS IN RESPECTIVE REGIONS

BACKGROUND OF THE INVENTION

1. Field of the Invention

Embodiments of the present invention relates to integrated circuit semiconductor devices and/or methods of fabricating integrated circuit semiconductor devices.

This application claims the priority of Korean Patent Application No. 2003-44350, filed on Jul. 1, 2003, in the Korean Intellectual Property Office, the disclosure of which is incorporated herein in its entirety by reference.

2. Description of the Related Art

As technology progresses, integrated circuit semiconductor devices formed on semiconductor wafers are decreasing in size and require more functionality to perform applications. For example, an integrated circuit semiconductor device, which uses an external power source to improve clock speed, may require a large driving current. In an integrated circuit semiconductor device used in a mobile device, even if the clock speed is low, low power dissipation may be required. A high-speed integrated circuit semiconductor device and a low-power dissipation integrated circuit semiconductor device have different threshold voltages. These threshold voltages affect the driving current of a transistor.

Integrated circuit semiconductor devices included on a semiconductor wafer may have different threshold voltages due to manufacturing variations. For a high-speed integrated circuit semiconductor device, the concentration of impurity ions for controlling the threshold voltage may be low. The high-speed integrated circuit semiconductor device may therefore be sensitive to variations in threshold voltages. For example, the variations in threshold voltages in the respective regions of the semiconductor wafer may reduce manufacturing yield and degrade reliability of manufactured integrated circuit semiconductor devices.

SUMMARY OF THE INVENTION

Embodiments of the present invention provide a semiconductor wafer including integrated circuit semiconductor devices, in which the semiconductor wafer has a substantially uniform threshold voltage in all regions due to different impurity concentrations in the respective regions of the semiconductor wafer. In embodiments, gate patterns are formed on the semiconductor wafer having different lengths in the respective regions.

The semiconductor wafer may have different impurity concentrations in a central region, an intermediate region, and an outer region. The impurity concentration of the intermediate region may be lower than the central region and higher than the outer region. The gate patterns may have different lengths in the central region, the intermediate region, and the outer region of the semiconductor wafer. The length of each of the gate patterns formed in the intermediate region may be longer than the gate patterns formed in the central region and shorter than the gate patterns formed in the outer region.

According to embodiments of the present invention, a semiconductor wafer has different impurity concentrations in a central region, an intermediate region, and an outer region. Also, gate patterns formed on the semiconductor wafer may have different lengths in the central region, the intermediate region, and the outer region of the semiconductor wafer. The impurity concentration in the intermediate region may be less than in the central region and greater than in the outer region. The length of the gate patterns formed in the intermediate region may be longer than the length of the gate patterns in the central region and shorter than the length of the gate patterns in the outer region.

According to embodiments of the present invention, a semiconductor wafer including integrated circuit semiconductor devices has different impurity concentrations in a central region, an intermediate region, and an outer region. The impurity concentration of the intermediate region may be less than the central region and greater than the outer region. Gate patterns may be formed on the semiconductor wafer having different lengths in the central region, the intermediate region, and the outer region of the semiconductor wafer. The length of each of the gate patterns formed in the intermediate region may be longer than the gate patterns in the central region and shorter than the gate patterns in the outer region.

According to embodiments of the present invention, a method of fabricating an integrated circuit semiconductor devices comprises implanting impurity ions for controlling threshold voltage into a semiconductor at different concentrations in respective regions of a semiconductor wafer. A conductive layer may be formed on the semiconductor wafer and then patterned to form gate patterns having different lengths in the respective regions. Impurity ions may be implanted into a central region, an intermediate region, and an outer region of the semiconductor wafer at different concentrations. The impurity ions may be implanted into the intermediate region at a lower concentration than the central region and at a higher concentration than the outer region. The gate patterns in the central region, the intermediate region, and the outer region of the semiconductor wafer may have different lengths. The gate patterns formed in the intermediate region may be longer than the gate patterns formed in the central region and shorter than the gate patterns formed in the outer region.

According to embodiments of the present invention, a method of fabricating an integrated circuit semiconductor devices comprises implanting impurity ions for controlling threshold voltage into a semiconductor wafer. The impurity ions may be implanted into a central region, an intermediate region, and an outer region of the semiconductor wafer at different concentrations. A conductive layer may be formed on the semiconductor wafer and then patterned to form gate patterns in the central region, the intermediate region, and the outer region of the semiconductor wafer having different lengths. The impurity ions may be implanted into the intermediate region at a lower concentration than the central region and at a higher concentration than the outer region. The gate patterns formed in the intermediate region may be longer than the gate patterns formed in the central region and shorter than the gate patterns formed in the outer region.

According to embodiments of the present invention, a method of fabricating integrated circuit semiconductor devices comprises implanting impurity ions for controlling threshold voltage into a semiconductor wafer having a central region, an intermediate region, and an outer region at different concentrations. The impurity ions may be implanted into the intermediate region at a lower concentration than the central region and at a higher concentration than the outer region. A conductive layer may be formed on the semiconductor wafer and patterned to form gate patterns in the central region, the intermediate region, and the outer region of the semiconductor wafer having different lengths.

The gate patterns formed in the intermediate region may be longer than those formed in the central region and shorter than those formed in the outer region.

BRIEF DESCRIPTION OF THE DRAWINGS

Example

Example

Example

Example

Example

Example

Example

DETAILED DESCRIPTION OF THE INVENTION

Embodiments of the present invention are described below with reference to the accompanying drawings, in which exemplary embodiments of the invention are shown. This invention may, however, be embodied in many different forms and should not be construed as being limited to the embodiment set forth herein. Rather, these embodiments are provided so that this disclosure is thorough and complete and fully conveys the concept of the invention to those skilled in the art.

Figure 1:
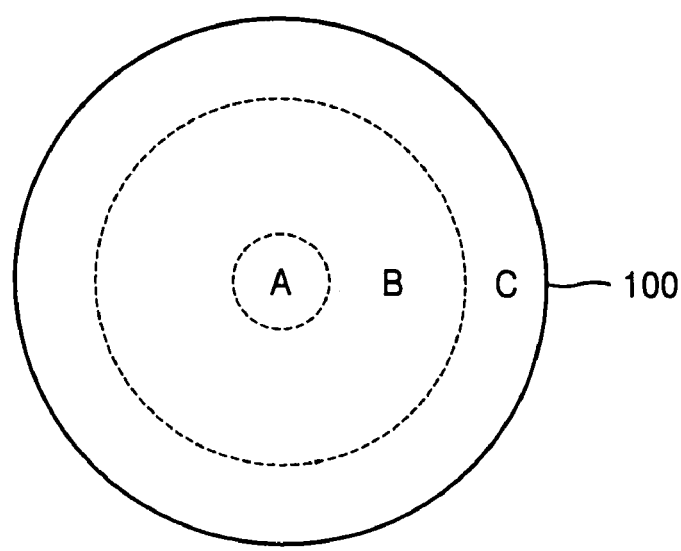
FIG. 1 illustrates a semiconductor wafer including integrated circuit semiconductor devices.
Figure 2:
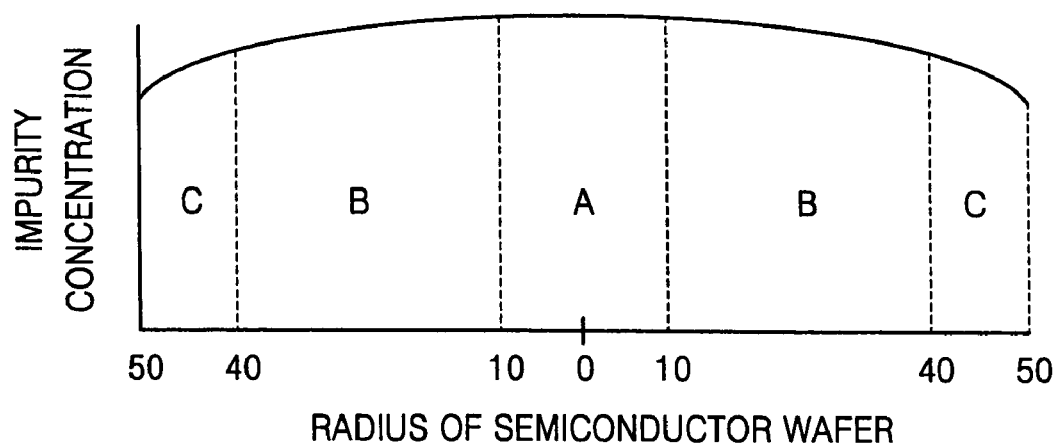
FIG. 2 is a graph illustrating an example of the distribution of impurity concentration in a semiconductor wafer.

Example FIG. 1 illustrates a semiconductor wafer including integrated circuit semiconductor devices. Example FIG. 2 is a graph illustrating an example of the impurity concentration distribution in the semiconductor wafer shown in FIG. 1.

As illustrated in example FIG. 1, a semiconductor wafer 100 has different impurity concentrations in different regions. For example, as illustrated in example FIG. 2, a central region A, an intermediate region B, and an outer region C of the semiconductor wafer 100 each have different impurity concentrations. The impurity concentration of the intermediate region B is lower than the impurity concentration of the central region A and higher than the impurity concentration of the outer region C. For the purposes of example, the diameter of the semiconductor wafer 100 is 100 arbitrary units. The central region A has a diameter of 20 arbitrary units. The intermediate region B is an annulus with an inner diameter of 20 arbitrary units and an outer diameter of 80 arbitrary units. The outer region C is an annulus with an inner diameter of 80 arbitrary units and an outer diameter of 100 arbitrary units.

In embodiments, the integrated circuit semiconductor device is an NMOS device and the approximate length of gate patterns is 0.25 µm in the intermediate region B. In these embodiments, the central region A, the intermediate region B, and the outer region C may have implanted boron ions at doses of $5.0E12/cm^2$, $4.9E12/cm^2$, and $4.8E12/cm^2$, respectively.

Figure 3:
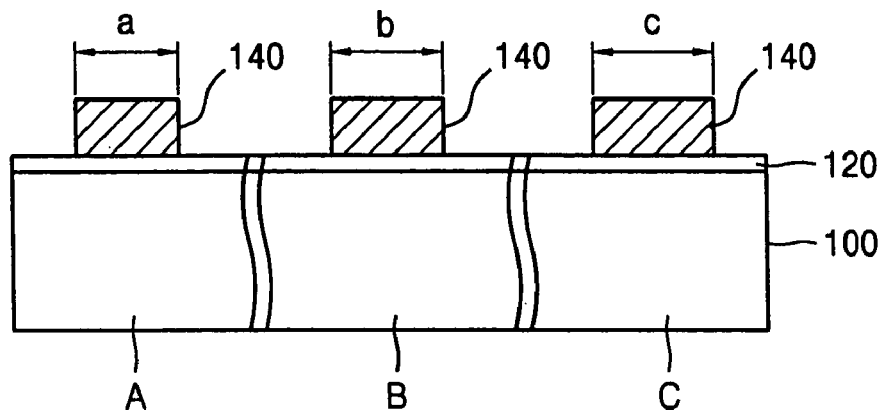
FIG. 3 is a sectional view illustrating an example of the lengths of gate patterns of a semiconductor wafer.
Figure 4:
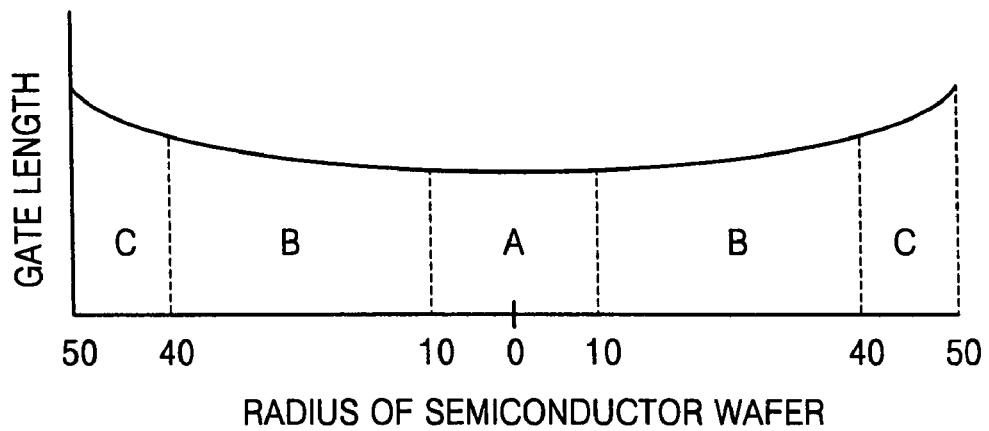
FIG. 4 is a graph illustrating the lengths of gate patterns.

Example FIG. 3 is a sectional view illustrating an example of the lengths of gate patterns of the semiconductor wafer shown in example FIG. 1 and example FIG. 4 is a graph illustrating the lengths of the gate patterns shown in example FIG. 3.

In example FIGS. 3 and 4, the integrated circuit semiconductor device comprises gate patterns 140, which are formed on the semiconductor wafer 100 and may have different lengths in respective regions. In embodiments, the gate patterns 140 have different lengths in the central region A, the intermediate region B, and the outer region C of the semiconductor wafer 100. For example, length "b" of the gate pattern 140 formed in the intermediate region B is longer than a length "a" of the gate pattern 140 formed in the central region A. Further, the length "b" is shorter than a length "c" of the gate pattern 140 formed in the outer region C. In example FIG. 3, reference numeral 120 denotes a gate insulating layer. For example, when the length "b" of the gate pattern 140 in the intermediate region B is 0.25 µm, the length "a" of the gate pattern 140 in the central region A and the length "c" of the gate pattern 140 in the outer region C may be 0.23 µm and 0.27 µm, respectively.

Figure 5:
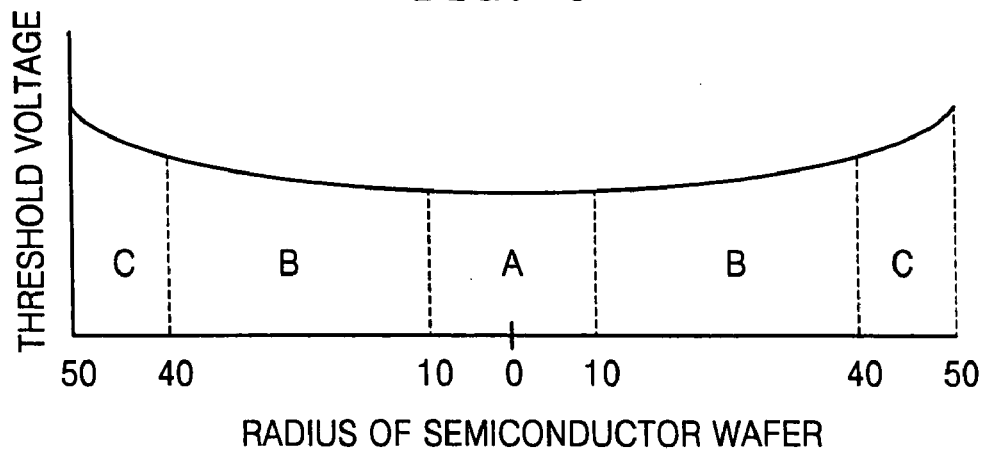
FIG. 5 is a graph illustrating varied threshold voltages in respective regions of integrated circuit semiconductor devices of a semiconductor wafer.
Figure 6:
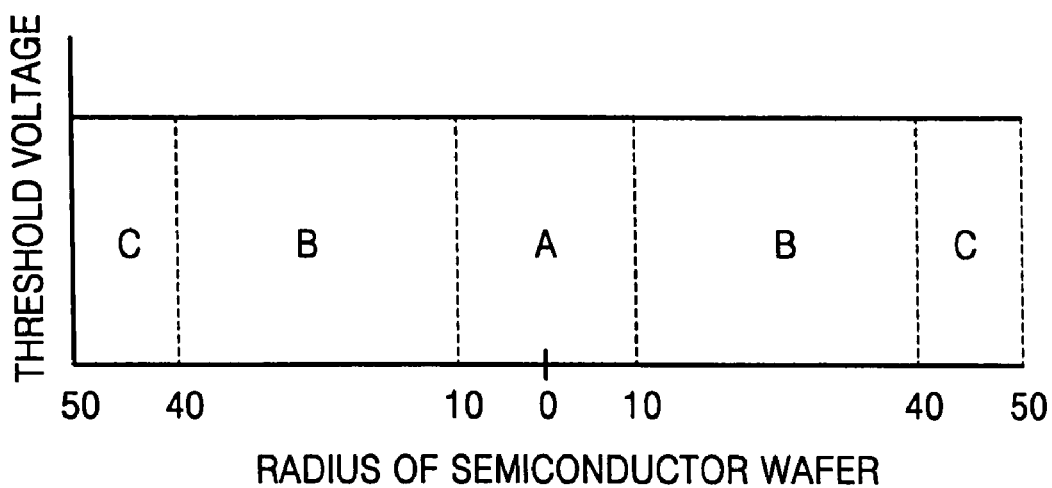
FIG. 6 is a graph illustrating substantially uniform threshold voltages in respective regions of a semiconductor wafer.

Example FIGS. 5 and 6 are graphs illustrating threshold voltages of devices in respective regions of a uniformly doped semiconductor wafer and a semiconductor wafer 100. In example FIGS. 5 and 6, the same reference numerals are used to denote the same elements as in example FIGS. 1 through 4. Example FIG. 5 is a graph illustrating the threshold voltages in the respective regions of a uniformly doped semiconductor wafer where the impurity concentration is substantially constant throughout the entire wafer and the lengths of gate patterns varies according to the respective regions. In example FIG. 5, the threshold voltage varies in the respective regions of the semiconductor wafer. For example, the threshold voltage in the intermediate region B is greater than the threshold voltage in the central region A and less than the threshold voltage in the outer region C. For example, in example FIG. 5, the threshold voltage in the intermediate region B may be approximately 0.55 V, the threshold voltage in the central region A may be approximately 0.53V and the threshold voltage in the outer region C may be approximately 0.57 V.

Example FIG. 6 is a graph illustrating the threshold voltages of devices in respective regions of the semiconductor wafer 100. The respective regions of the semiconductor wafer 100 have different impurity concentrations and the gate patterns 140 with different lengths. In example FIG. 6, the entire semiconductor wafer 100 exhibits a substantially uniform threshold voltage. That is, the central region A, the intermediate region B, and the outer region C have substantially the same threshold voltage. For example, when the threshold voltage in the intermediate region B is approximately 0.55 V, the threshold voltages in the central region A and the outer region C are also both approximately 0.55 V.

Figure 7:
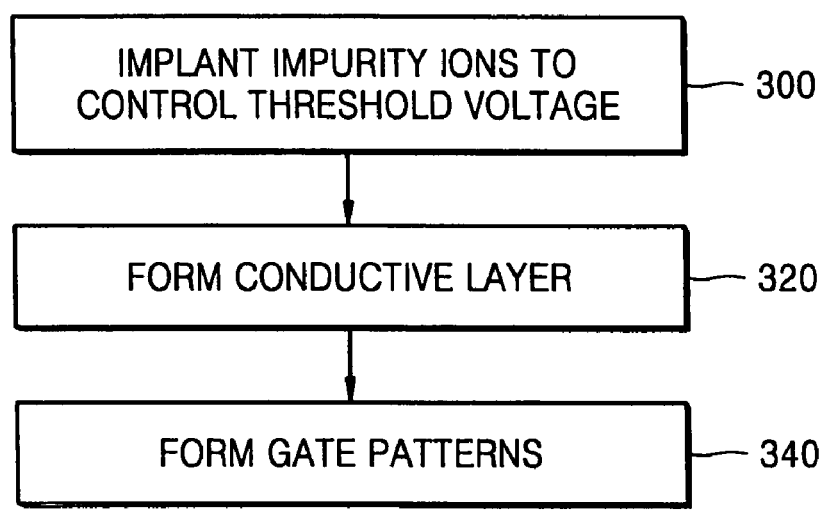
FIG. 7 is a flowchart illustrating a method of fabricating integrated circuit semiconductor devices.

Example FIG. 7 is a flowchart illustrating a method of fabricating an integrated circuit semiconductor device according to embodiments of the present invention. In example FIG. 7, the same reference numerals are used to denote the same elements as in example FIGS. 1 through 6. Impurity ions for controlling threshold voltages are implanted at different concentrations in respective regions of a semiconductor wafer 100 (Step 300). For example, as shown in example FIG. 2, the impurity ions are implanted into each of the central region A, the intermediate region B, and the outer region C of the semiconductor wafer 100 at different concentrations. The impurity ions may be implanted in the intermediate region B at a lower concentration than in the central region A and at a higher concentration than in the outer region C.

In embodiments, the integrated circuit semiconductor devices are NMOS devices. If, for example, the length of each of the gate patterns 140 is approximately 0.25 μm in intermediate region B, then boron ions may be implanted into the central region A, the intermediate region B, and the outer region C at doses of $5.0E12/cm^2$, $4.9E12/cm^2$, and $4.8E12/cm^2$, respectively.

A conductive layer 120 may be formed on the semiconductor wafer (Step 320). The conductive layer may be a doped polysilicon layer. The conductive layer may be patterned by photolithography and/or etching processes. The gate patterns 140 with different lengths in the respective regions may be formed on the semiconductor wafer 100 (Step 340). For example, as shown in example FIG. 3, the gate patterns 140 are formed at different lengths in the central region A, the intermediate region B, and the outer region C of the semiconductor wafer 100.

The length "b" of the gate pattern 140 in the intermediate region B may be greater than the length "a" of the gate pattern 140 in the central region A and less than the length "c" of the gate pattern 140 in the outer region C. For example, when the length "b" of the gate pattern 140 in the intermediate region B is 0.25 μm, the lengths "a" and "b" of the gate pattern 140 in the central region A and the outer region C are 0.23 μm and 0.27 μm, respectively.

During photolithography and etching processes to form the gate patterns 140, the lengths of the gate patterns 140 may naturally vary according to the regions of the semiconductor wafer 100 due to loading effects. Because of loading effects, the length "a" of the gate pattern 140 formed in the central region A may naturally be less than the length "b" of the gate pattern 140 formed in the intermediate region B. Likewise, the length "b" of the gate pattern 140 formed in the intermediate region B may naturally be less than the length "c" of the gate pattern 140 formed in the outer region C. Accordingly, in embodiments, only the impurity concentration must be controlled according to the regions of the semiconductor wafer 100.

As described above, the integrated circuit semiconductor device of embodiments of the present invention comprises a semiconductor wafer with different impurity concentrations in respective regions and gate patterns with different lengths in the respective regions formed on the semiconductor wafer. Thus, integrated circuit semiconductor devices included on the semiconductor wafer may have a substantially uniform threshold voltages.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of fabricating a plurality of integrated circuit semiconductor devices on a semiconductor wafer, the semiconductor wafer having a plurality of concentric regions, each concentric region having a different impurity concentration, the method comprising:
   forming a conductive layer on the semiconductor wafer; and
   patterning the conductive layer to form different gate patterns having different lengths in the respective concentric regions of the semiconductor wafer.

2. The method of claim 1, wherein the plurality of concentric regions comprises a central region, an intermediate region, and an outer region respectively formed on the semiconductor wafer.

3. The method of claim 2, wherein the impurity concentration of the intermediate region is lower than the impurity concentration than of the central region and higher than the concentration of the outer region.

4. The method of claim 3, wherein the different gate patterns comprise; a first gate pattern length formed in the central region, a second gate pattern length formed in the intermediate region, and a third gate pattern length formed in the outer region of the semiconductor wafer.

5. The method of claim 4, wherein:
   the second gate pattern length formed in the intermediate region is longer than the first gate pattern length formed in the central region and is shorter than the third gate pattern length formed in the outer region.

6. A method of fabricating a plurality of integrated circuit semiconductor devices, the method comprising:
   providing a semiconductor wafer comprising a central region, an intermediate region, and an outer region each having different respective concentrations of impurities, the central, intermediate, and outer regions being concentrically formed around a common center of the semiconductor wafer;
   forming a conductive layer on the semiconductor wafer; and
   patterning the conductive layer to form different gate patterns having different respective lengths in the central region, the intermediate region, and the outer region of the semiconductor wafer.

7. The method of claim 6, wherein the impurity concentration in the intermediate region is lower than the impurity concentration of the central region and higher then the impurity concentration of the outer region.

8. The method of claim 7, wherein:
   the gate pattern formed in the intermediate region is longer than the gate pattern formed in the central region and shorter than the gate pattern formed in the outer region.

9. A method comprising:
   providing a semiconductor wafer having a plurality of concentrically related regions, each having a different impurity concentration;
   forming a plurality of different transistors, wherein each different transistor has a gate with a different length and is formed in one of the concentrically related regions of the semiconductor wafer.

10. The method of claim 9, wherein respective threshold voltages of the different transistors are substantially the same across the concentrically related regions of the semiconductor wafer.

11. The method of claim 9, wherein the different impurity concentrations of the concentrically related regions vary in relation to their respective radial distance from a common center of the semiconductor wafer.

12. The method of claim 9, wherein providing the semiconductor wafer comprises:
   performing a single implantation process sufficient to form the different respective concentrations of impurities in the concentrically related regions of the semiconductor wafer.

13. The method of claim 1, wherein the respective impurity concentrations in the plurality of concentric regions of the semiconductor wafer vary in relation to their respective radial distance from a common center of the semiconductor wafer.

14. The method of claim 13, wherein the different gate patterns correspond one-for-one with the different impurity concentrations, such that the entire plurality of integrated semiconductor devices operate at substantially the same threshold voltage.

15. The method of claim 6, wherein the different respective concentrations of impurities vary in relation to their respective radial distance from a common center of the semiconductor wafer.

16. The method of claim 15, wherein each one of the different gate patterns correspond with one of the different concentrations of impurities, such that the entire plurality of integrated semiconductor devices operate at substantially the same threshold voltage.

17. The method of claim 16, wherein providing the semiconductor wafer comprises:
performing a single implantation process sufficient to form the different respective concentrations of impurities in the central region, the intermediate, and the outer region.

* * * * *